United States Patent
Ando et al.

(10) Patent No.: US 9,606,163 B2
(45) Date of Patent: Mar. 28, 2017

(54) GROUND FAULT DETECTING CIRCUIT AND POWER CONVERTING DEVICE INCLUDING THE SAME

(75) Inventors: Akinobu Ando, Chuo-ku (JP); Hiroshi Ogino, Chuo-ku (JP); Yasuaki Matsumoto, Chuo-ku (JP); Shigeyuki Nakabayashi, Chuo-ku (JP); Yasuhiko Hosokawa, Chuo-ku (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 193 days.

(21) Appl. No.: 14/390,118

(22) PCT Filed: Apr. 9, 2012

(86) PCT No.: PCT/JP2012/059670
§ 371 (c)(1),
(2), (4) Date: Dec. 15, 2014

(87) PCT Pub. No.: WO2013/153596
PCT Pub. Date: Oct. 17, 2013

(65) Prior Publication Data
US 2015/0130379 A1    May 14, 2015

(51) Int. Cl.
*H02H 7/08* (2006.01)
*G01R 31/02* (2006.01)
(Continued)

(52) U.S. Cl.
CPC .......... *G01R 31/025* (2013.01); *G01R 31/40* (2013.01); *G01R 31/42* (2013.01); *H02H 3/165* (2013.01);
(Continued)

(58) Field of Classification Search
CPC .. G01R 31/025; G01R 31/343; G01R 31/024; G01R 31/1272; G01R 31/346;
(Continued)

(56) References Cited

U.S. PATENT DOCUMENTS 3,665,495 A * 5/1972 Carter ................... H02J 9/066
290/4 R
4,430,683 A * 2/1984 Kawai ................... G01R 27/18
361/42
(Continued)

FOREIGN PATENT DOCUMENTS

JP    50-41036 A    4/1975
JP    55-147930 A   11/1980
(Continued)

OTHER PUBLICATIONS

Extended European Search Report issued on May 13, 2016 in European Patent Application No. 12874321.8.
(Continued)

*Primary Examiner* — Paul Ip
(74) *Attorney, Agent, or Firm* — Oblon, McClelland, Maier & Neustadt, L.L.P.

(57) ABSTRACT

In the ground fault detecting circuit, one terminals of first to third resistance elements are connected to first to third AC lines, respectively, the other terminals of the first to third resistance elements are commonly connected to one terminal of a fourth resistance element, and the other terminal of the fourth resistance element is connected to a line of a ground voltage. On the basis of a voltage across the terminals of the fourth resistance element, the ground fault detecting circuit detects whether a ground fault has occurred or not. Since a current does not flow through the fourth resistance element in the normal state and flows through the fourth resistance element after the occurrence of a ground fault, it is possible
(Continued)

to detect the occurrence of the ground fault at a high accuracy.

4 Claims, 9 Drawing Sheets

(51) Int. Cl.
    *H02H 3/16*     (2006.01)
    *H02H 7/12*     (2006.01)
    *H02M 5/45*     (2006.01)
    *H02P 6/12*     (2006.01)
    *H02P 6/24*     (2006.01)
    *G01R 31/40*     (2014.01)
    *G01R 31/42*     (2006.01)

(52) U.S. Cl.
    CPC ............ *H02H 7/1216* (2013.01); *H02M 5/45* (2013.01); *H02P 6/12* (2013.01); *H02P 6/24* (2013.01)

(58) Field of Classification Search
    CPC ...... G01R 19/10; G01R 27/18; G01R 31/007; G01R 31/42; H02H 1/0015; H02H 3/165; H02H 1/04; H02H 3/027; H02H 3/331; H02H 3/335
    USPC .......................... 318/400.21, 432; 361/31, 42
    See application file for complete search history.

(56) References Cited

U.S. PATENT DOCUMENTS

| | | | | |
|---|---|---|---|---|
| 4,475,150 A * | 10/1984 | D'Atre | ............... | H02M 5/4505 318/806 |
| 4,618,810 A * | 10/1986 | Hagerman | .............. | H02P 27/06 318/798 |
| 4,825,327 A * | 4/1989 | Alexander | .............. | H02H 7/26 361/65 |
| 5,185,685 A * | 2/1993 | Tennies | ............... | H02H 1/0015 324/522 |
| 5,214,575 A * | 5/1993 | Sugishima | ........... | H02H 7/1216 361/42 |
| 5,754,114 A * | 5/1998 | Gnadt | .................. | H02H 11/001 340/649 |
| 5,963,406 A * | 10/1999 | Neiger | ................. | H02H 1/0015 361/42 |
| 6,339,525 B1 * | 1/2002 | Neiger | ................. | H02H 1/0015 361/42 |
| 6,593,751 B2 * | 7/2003 | Takahashi | ........... | G01R 31/346 324/509 |
| 6,984,988 B2 * | 1/2006 | Yamamoto | ........... | B60L 3/0023 324/503 |
| 7,154,277 B2 * | 12/2006 | Vallinmaki | ........... | H02M 5/458 324/509 |
| 7,233,465 B2 * | 6/2007 | Lee | ........................ | H02H 3/027 361/42 |
| 2001/0048310 A1 * | 12/2001 | Takahashi | ............ | G01R 31/346 324/551 |
| 2003/0197989 A1 * | 10/2003 | Nojima | ..................... | B60L 3/00 361/47 |
| 2005/0047035 A1 * | 3/2005 | Vallinmaki | ........... | H02M 5/458 361/42 |
| 2005/0099743 A1 * | 5/2005 | Lee | ........................ | H02H 3/027 361/42 |
| 2005/0280422 A1 | 12/2005 | Kishibata et al. | | |
| 2006/0001392 A1 * | 1/2006 | Ajima | .................... | B62D 5/046 318/432 |
| 2006/0056206 A1 * | 3/2006 | Kifuku | ................... | H02M 1/32 363/15 |
| 2007/0211396 A1 * | 9/2007 | Gunji | ................... | B62D 5/0487 361/31 |
| 2009/0051427 A1 * | 2/2009 | Miyashita | ................ | H03F 1/52 330/251 |
| 2009/0167314 A1 | 7/2009 | Hoffmann | | |
| 2010/0097733 A1 * | 4/2010 | E. | ......................... | H02H 1/0015 361/42 |
| 2011/0080676 A1 * | 4/2011 | Yoshida | ............... | G01R 31/025 361/30 |
| 2011/0241590 A1 * | 10/2011 | Horikoshi | ........... | H02P 29/0241 318/490 |
| 2011/0307196 A1 * | 12/2011 | Schumacher | ........ | G01R 31/025 702/58 |
| 2011/0316460 A1 * | 12/2011 | Yasuoka | .............. | H02H 7/0805 318/400.22 |
| 2012/0043967 A1 * | 2/2012 | Miura | .................... | B60L 3/0069 324/426 |
| 2012/0089266 A1 * | 4/2012 | Tomimbang | ......... | H02H 1/0015 700/293 |
| 2013/0314013 A1 * | 11/2013 | Ajima | ..................... | H02P 23/00 318/400.21 |

FOREIGN PATENT DOCUMENTS

| | | |
|---|---|---|
| JP | 63-265516 | 11/1988 |
| JP | 9-84254 A | 3/1997 |
| JP | 2003-61380 | 2/2003 |
| JP | 2009-131048 | 6/2009 |
| JP | 2009-526203 | 7/2009 |
| JP | 2010-130704 | 6/2010 |
| JP | 2011-130634 | 6/2011 |
| JP | 2012-39711 | 2/2012 |
| JP | 2012-119244 | * 5/2012 |

OTHER PUBLICATIONS

Office Action issued on Nov. 17, 2015 in Japanese Patent Application No. 2014-509916 with English translation.
"Thyristor Starter Used in Thermal Power Station", Mitsubishi Electric Technical Report, Mitsubishi Denki GIHO, vol. 67, No. 5, 1993, 9 pages (with partial English-language translation).
International Search Report issued May 22, 2012, in PCT/JP2012/059670, filed Apr. 9, 2012.
"Thyristor Starter Used in Thermal Power Station", Mitsubishi Electric Technical Report, Mitsubishi Denki Giro, vol. 67, No. 5, 1993, 9 pages (with partial English-language translation).

* cited by examiner

GROUND FAULT DETECTING CIRCUIT AND POWER CONVERTING DEVICE INCLUDING THE SAME

TECHNICAL FIELD

The present invention relates to a ground fault detecting circuit and a power converting device including the same, and in particular relates to a ground fault detecting circuit for detecting a ground fault and a power converting device including the same.

BACKGROUND ART

A thyristor starter is provided with a converter configured to convert three-phase AC power of a commercial frequency to DC power, a DC reactor configured to smooth the DC power, and an inverter configured to convert the DC power supplied from the converter through the intermediary of the DC reactor to three-phase AC power of a desired frequency and supply the converted three-phase AC power to a synchronous motor through first to third AC lines. On the basis of the control on the three-phase AC power applied to the synchronous motor, it is possible to start the synchronous motor in a stopped state and drive it to rotate at a predetermined revolution speed (for example, see Japanese Patent Laying-Open No. 2003-61380 (PTD 1)).

In such thyristor starter, a ground fault detecting circuit is provided for detecting a ground fault. If a ground fault is detected by the ground fault detecting circuit, the operation of the thyristor starter will be stopped.

As a conventional ground fault detecting circuit, there is one achieved by connecting a three-phase transformer to the first to third AC lines between the thyristor starter and the synchronous motor, and configured to detect the occurrence of a ground fault on the basis of an output voltage from the three-phase transformer (for example, see Japanese Patent Laying-Open No. 2009-131048 (PTD 2), Japanese Patent Laying-Open No. 2010-130704 (PTD 3), and Japanese Patent Laying-Open No. 2011-130634 (PTD 4)).

As a conventional ground fault detecting circuit, there is another one in which one terminal of a first resistance element and one terminal of a second resistance element are connected to two input terminals of an inverter, respectively, a third resistance element is connected between the other terminals of the first and second resistance elements and a line of a ground voltage, and configured to detect the occurrence of a ground fault on the basis of a voltage across the terminals of the third resistance element (for example, see "Thyristor Starter Used in Thermal Power Station", Mitsubishi Electric Technical Report, Vol. 67, No. 5, 1993 (NPD 1)).

CITATION LIST

Patent Document

PTD 1: Japanese Patent Laying-Open No. 2003-61380
PTD 2: Japanese Patent Laying-Open No. 2009-131048
PTD 3: Japanese Patent Laying-Open No. 2010-130704
PTD 4: Japanese Patent Laying-Open No. 2011-130634

Non Patent Document

NPD 1: "Thyristor Starter Used in Thermal Power Station", Mitsubishi Electric Technical Report, Vol. 67, No. 5, 1993.

SUMMARY OF INVENTION

Technical Problem

However, in the ground fault detecting circuit of PTDs 2 to 4, the usage of a three-phase transformer makes the circuit large in size and expensive in price. Moreover, in the ground fault detecting circuit of NPD 1, the detection accuracy is poor.

Therefore, a major object of the present invention to provide a ground fault detecting circuit which is compact in size, cheap in price and high in accuracy, and a power converting device including the same.

Solution to Problem

A ground fault detecting circuit according to the present invention is configured to detect the occurrence of a ground fault in a power converting device which converts a first three-phase AC power to DC power, converts the DC power to a second three-phase AC power, and supplies the second three-phase AC power to a load through first to third AC lines, and includes first to fourth resistance elements. One terminals of the first to third resistance elements are connected to the first to third AC lines, respectively, the other terminals of the first to third resistance elements are commonly connected to one terminal of the fourth resistance elements, and the other terminal of the fourth resistance element is configured to receive a ground voltage. The ground fault detecting circuit further includes a determination circuit configured to determine whether or not the ground fault has occurred in the power converting device on the basis of a voltage across the terminals of the fourth resistance element.

A power converting device according to the present invention includes a converter configured to convert a first three-phase AC power to DC power, a DC reactor configured to smooth the DC power, an inverter configured to convert the DC power supplied from the converter through the intermediary of the DC reactor to a second three-phase AC power, and supply the second three-phase AC power to a load through first to third AC lines, a ground fault detecting circuit configured to detect a ground fault in the power converting device, and a control circuit configured to stop the operation of the power converting device when the ground fault has been detected by the ground fault detecting circuit. The ground fault detecting circuit includes first to fourth resistance elements. One terminals of the first to third resistance elements are connected to the first to third AC lines, respectively, the other terminals of three of the resistance elements are commonly connected to one terminal of the fourth resistance elements, and the other terminal of the fourth resistance element is configured to receive a ground voltage. The ground fault detecting circuit further includes a determination circuit configured to determine whether or not the ground fault has occurred in the power converting device on the basis of a voltage across the terminals of the fourth resistance element.

Preferably, the determination circuit determines that the ground fault has occurred in the power converting device when the voltage across the terminals of the fourth resistance element is greater than a predetermined voltage.

Preferably, the determination circuit includes an absolute value calculator configured to calculate an absolute value of the voltage across the terminals of the fourth resistance element, and a comparator configured to output a signal representing that the ground fault has occurred in the power converting device when the absolute value calculated by the absolute value calculator on the voltage across the terminals of the fourth resistance element is greater than a predetermined value.

Preferably, the frequency of the second three-phase AC power is variable, the load is a synchronous motor, and the power converting device is a thyristor starter for starting the synchronous motor.

Preferably, the thyristor starter starts a synchronous generator in a power plant as the synchronous motor.

Advantageous Effects of Invention

In the ground fault detecting circuit according to the present invention, one terminals of the first to third resistance elements are connected to the first to third AC lines, respectively, the other terminals of the first to third resistance elements are commonly connected to one terminal of the fourth resistance elements, and the other terminal of the fourth resistance element is configured to receive a ground voltage. The determination circuit determines whether or not the ground fault has occurred in the power converting device on the basis of a voltage across the terminals of the fourth resistance element. Since a current does not flow through the fourth resistance element in the normal state and flows through the fourth resistance element after the occurrence of a ground fault, it is possible to detect the occurrence of the ground fault at a high accuracy. Moreover, since no three-phase transformer is used, it is possible to make the device compact in size and cheap in price.

DESCRIPTION OF EMBODIMENTS

Figure 1:
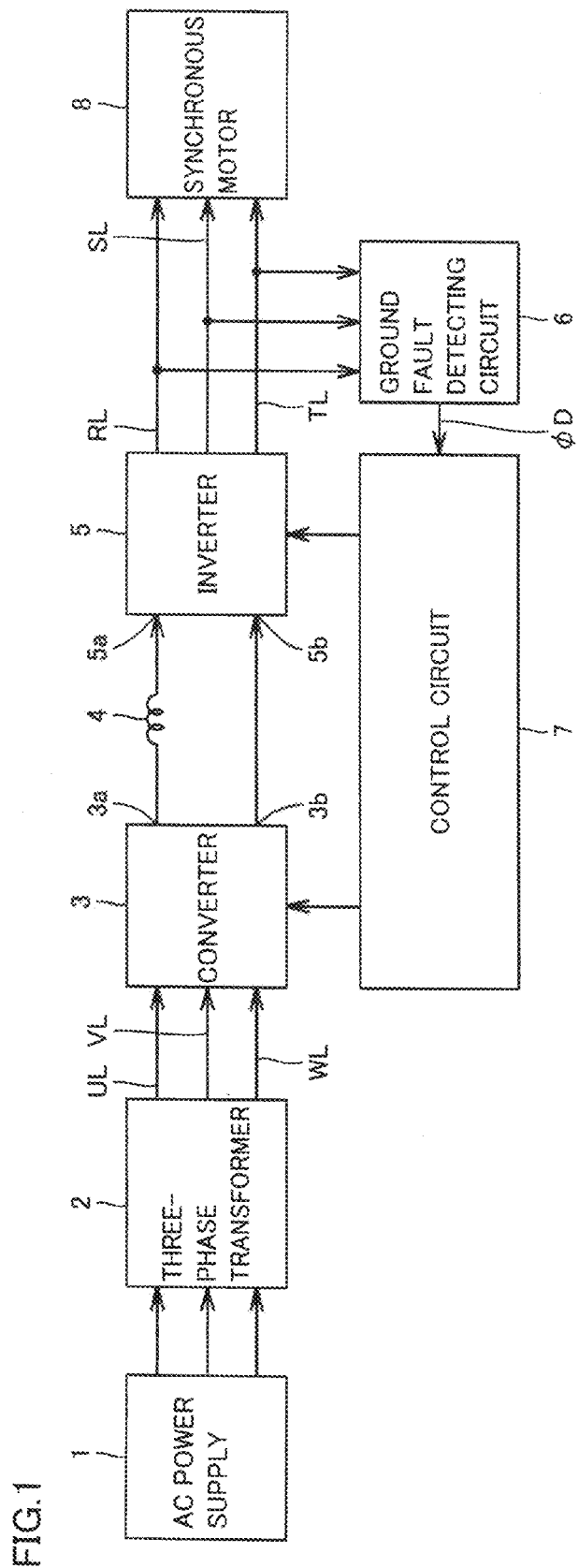
FIG. 1 is a circuit block diagram illustrating the configuration of a thyristor starter according to an embodiment of the present invention.

As illustrated in FIG. 1, a thyristor starter according to an embodiment of the present invention is configured to receive three-phase AC power from an AC power supply 1 so as to start a synchronous motor 8, and is provided with a three-phase transformer 2, a converter 3, a DC reactor 4, an inverter 5, a ground fault detecting circuit 6 and a control circuit 7.

Three-phase transformer 2 converts a three-phase AC voltage of a commercial frequency supplied from AC power supply (power system) 1 to a predetermined three-phase AC voltage. The three-phase AC voltage generated by three-phase transformer 2 is supplied to converter 3 through a U-phase line UL, a V-phase line VL and a W-phase line WL.

Converter 3 converts the three-phase AC power supplied from three-phase transformer 2 to DC power. DC reactor 4 is connected between a high-voltage output terminal 3a of converter 3 and a high-voltage input terminal 5a of inverter 5 for smoothing the DC power generated by converter 3. A low-voltage output terminal 3b of converter 3 is directly connected to a low-voltage input terminal 5b of inverter 5.

DC reactor 4 may be connected between low-voltage output terminal 3b of converter 3 and low-voltage input terminal 5b of inverter 5. In addition, DC reactor 4 may be connected between high-voltage output terminal 3a of converter 3 and high-voltage input terminal 5a of inverter 5 and between low-voltage output terminal 3b of converter 3 and low-voltage input terminal 5b of inverter 5, respectively.

Inverter 5 converts the DC power supplied from converter 3 through the intermediary of DC reactor 4 to three-phase AC power of a desired frequency and supplies the converted three-phase AC power to synchronous motor 8 through a R-phase line RL, an S-phase line SL and a T-phase line TL. Synchronous motor 8 is driven to rotate by the three-phase AC power supplied from inverter 5. When the three-phase AC power is gradually increased, the rotational speed (revolutions/min) of synchronous motor 8 increases gradually. And thereby, the switching frequency of inverter 5 increases in accordance with the rotational speed of synchronous motor 8. As a result, as the rotational speed of synchronous motor 8 increases gradually from 0 to a predetermined value, the frequency of the three-phase AC power increases gradually from 0 to the predetermined value.

Figure 2:
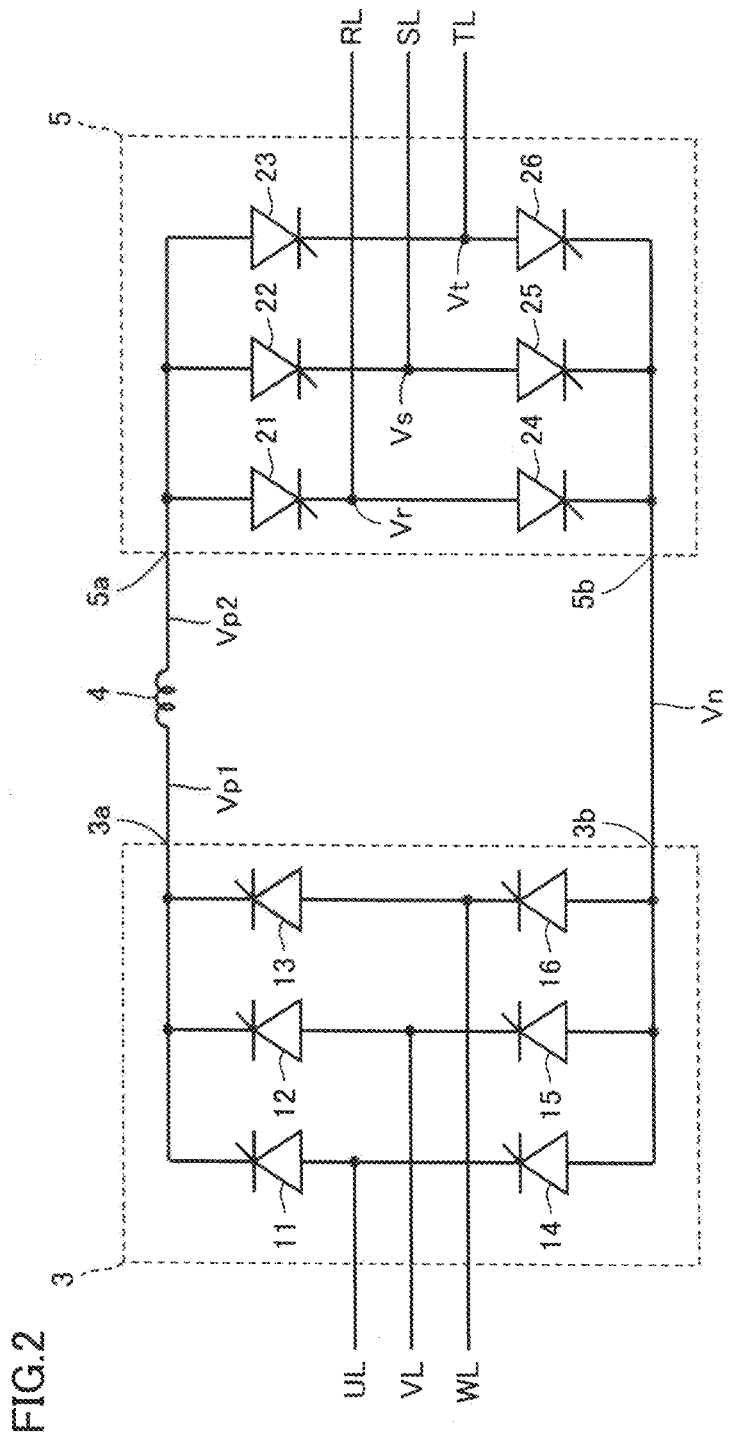
FIG. 2 is a circuit diagram illustrating the configuration of a converter and an inverter illustrated in FIG. 1.

FIG. 2 is a circuit diagram illustrating the configuration of converter 3 and inverter 5. In FIG. 2, converter 3 includes thyristors 11 to 16. The anodes of thyristors 11 to 13 are connected to U-phase line UL, V-phase line VL and W-phase line WL, respectively, and the cathodes thereof are commonly connected to high-voltage output terminal 3a. The cathodes of thyristors 14 to 16 are connected to U-phase line UL, V-phase line VL and W-phase line WL, respectively, and the anodes thereof are commonly connected to low-voltage output terminal 3b. Thyristors 11 to 16 are controlled by control circuit 7. By switching on thyristors 11 to 16 at predetermined timings, it is possible to convert the three-phase AC power to the DC power.

Inverter 5 includes thyristors 21 to 26. The anodes of thyristors 21 to 23 are commonly connected to high-voltage input terminal 5a, and the cathode thereof are connected to R-phase line RL, S-phase line SL and T-phase line TL, respectively. The anodes of thyristors 24 to 26 are connected to R-phase line RL, S-phase line SL and T-phase line TL, respectively, and the cathodes thereof are commonly connected to low-voltage input terminal 5b. Thyristors 21 to 26 is controlled by control circuit 7. By switching on thyristors 21 to 26 at predetermined timings, it is possible to convert the DC power to the three-phase AC power of a desired frequency.

Figure 3:
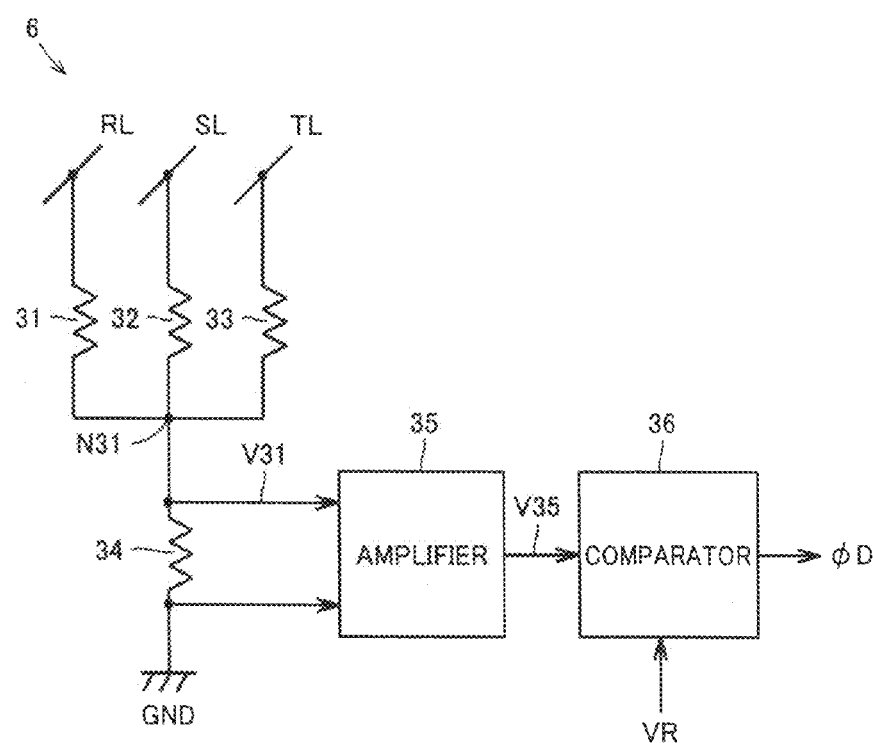
FIG. 3 is a circuit block diagram illustrating the configuration of a ground fault detecting circuit illustrated in FIG. 1.

Referring back to FIG. 1, ground fault detecting circuit 6 is such a circuit that detects the occurrence of a ground fault in the thyristor starter. As illustrated in FIG. 3, ground fault detecting circuit 6 includes resistance elements 31 to 34, an amplifier 35 and a comparator 36.

One terminals of resistance elements 31 to 33 are connected to R-phase line RL, S-phase line SL and T-phase line TL, respectively, and the other terminals thereof are commonly connected to a node N31. One terminal of resistance element 34 is connected to node N31, and the other terminal of resistance element 34 is connected to a line of a ground voltage GND.

Amplifier 35 amplifies a voltage V31 across the terminals of resistance element 34. Comparator 36 compares an output voltage V35 from amplifier 35 with a predetermined reference voltage VR, and outputs a signal ϕD at a level in accordance with the comparison result. When output voltage V35 from amplifier 35 is smaller than reference voltage VR (V35<VR), signal ϕD is set to an "L" level. When output voltage V35 from amplifier 35 is greater than reference voltage VR (VR<V35), signal ϕD is set to an "H" level.

If no ground fault occurs in the thyristor starter, the sum of the AC voltages of R phase, S phase and T-phase is about 0 V, and voltage V31 across the terminals of resistance element 34 is about 0 V. In this case, V35<VR, and thereby, signal ϕD is set to the "L" level which is a non-active level.

If a ground fault has occurred in the thyristor starter, a point that is grounded (for example, R-phase line RL) is connected to the other terminal of resistance element 34 (the line of ground voltage GND) to form a current flowing loop, and thereby, voltage V31 is generated across the terminals of resistance element 34. In this case, VR<V35, and thereby, signal ϕD is set to the "H" level which is an active level.

Control circuit 7 receives signals representing an input current to converter 3, an output voltage from inverter 5, a rotational speed of synchronous motor 8 and the like from a plurality of sensors (not shown), and controls converter 3 and inverter 5 on the basis of the signals received.

When synchronous motor 8 in a stopped state is started, as the rotational speed of synchronous motor 8 increases gradually from 0 to a predetermined value, control circuit 7 gradually increases the frequency of the three-phase AC power output from inverter 5 from 0 to the predetermined value.

When signal ϕD output from ground fault detecting ground 6 is set to the "H" level, control circuit 7 stops the operation of converter 3 and inverter 5 and switches off a plurality of breakers (not shown) so as to prevent the thyristor starter, synchronous motor 8 and the like from being damaged by the ground fault.

Such thyristor starter is used, for example, in a power plant, to start a synchronous generator which serves as a synchronous motor from a stopped state. After the synchronous generator has been started to rotate at a predetermined number of revolutions as a synchronous motor, the thyristor starter is detached from the synchronous generator, and the synchronous generator is driven by such as a gas turbine to rotate to generate the AC power.

In the present embodiment, resistance elements 31 to 33 are connected between AC lines RL, SL and TL, respectively, and node N31, resistance element 34 is connected between node N31 and the line of ground voltage GND, and whether or not a ground fault has occurred is determined on the basis of voltage V31 across the terminals of resistance element 34. When no ground fault occurs, voltage V31 is approximately 0 V, and when a ground fault has occurred, voltage V31 becomes significantly greater than 0 V, it is possible to detect the occurrence of a ground fault at a high accuracy. Moreover, since a three-phase transformer is not used in the present invention as in the prior art, it is possible to make the thyristor starter compact in size and cheap in price.

Figure 4:
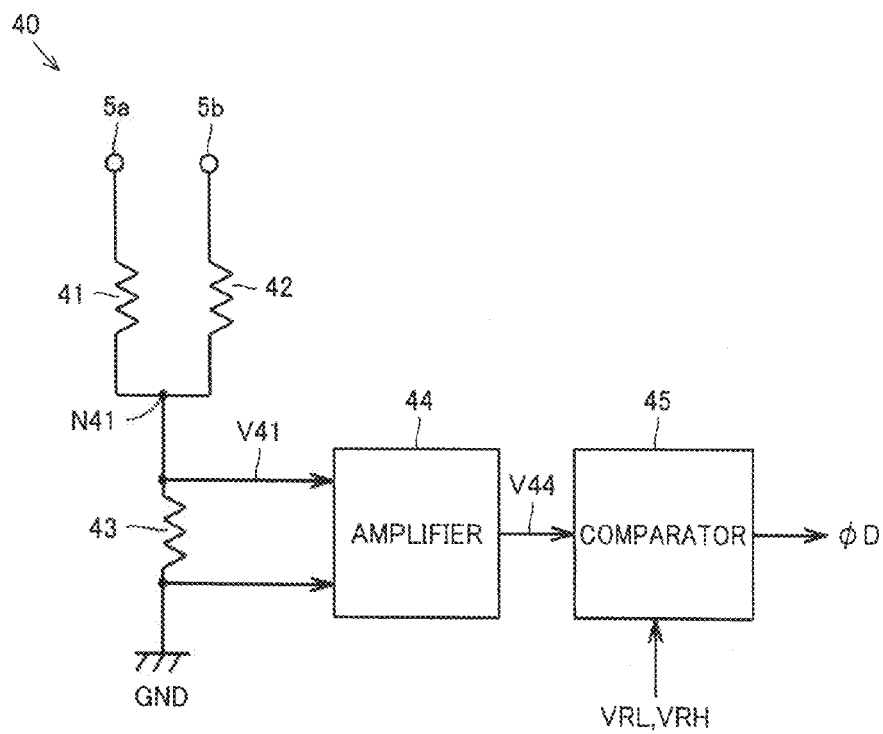
FIG. 4 is a circuit block diagram illustrating a comparative example of an embodiment of the present invention.
Figure 5:
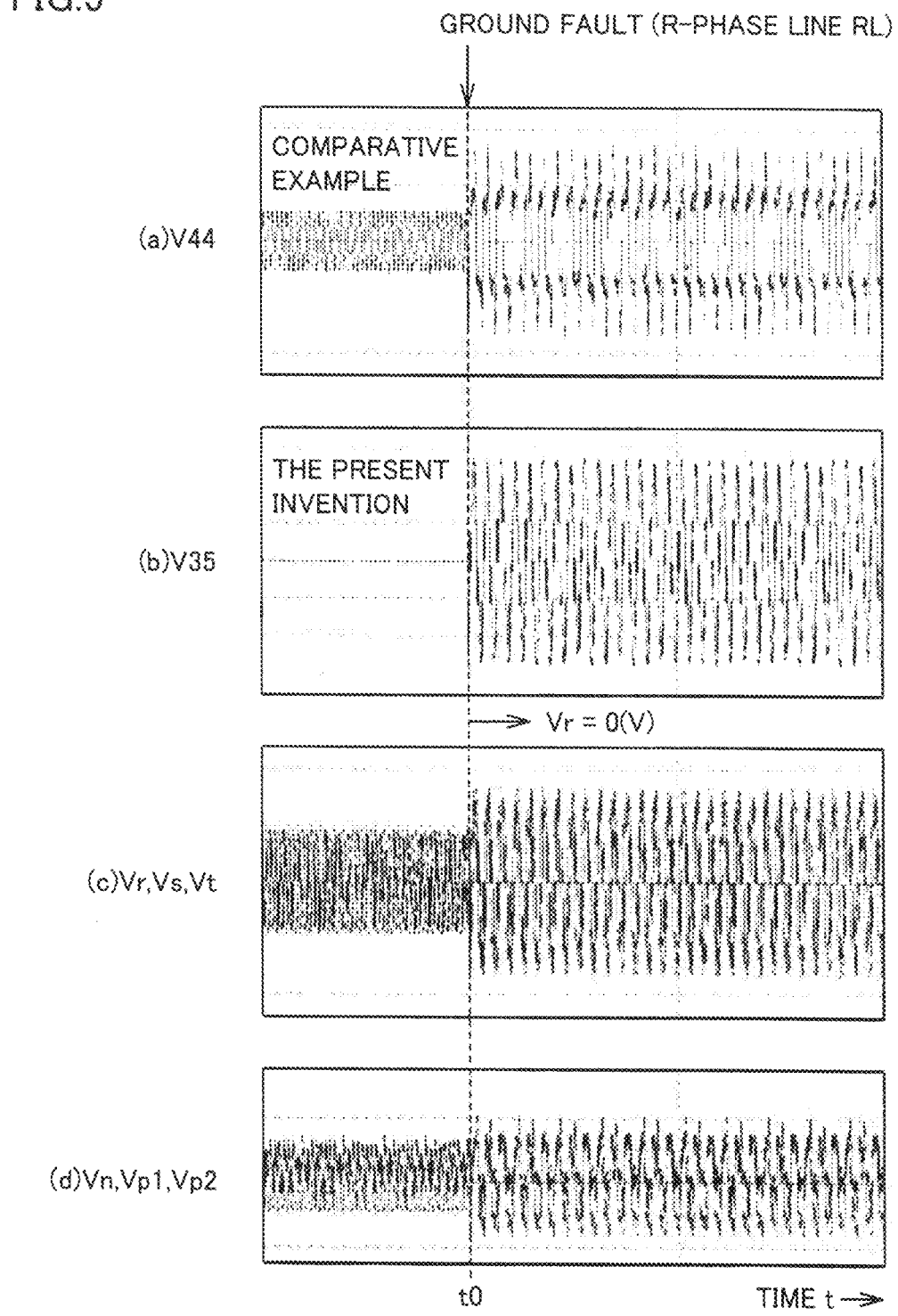
FIG. 5 is a time chart illustrating voltage fluctuations before and after the occurrence of a ground fault in a R-phase line illustrated in FIG. 2.
Figure 6:
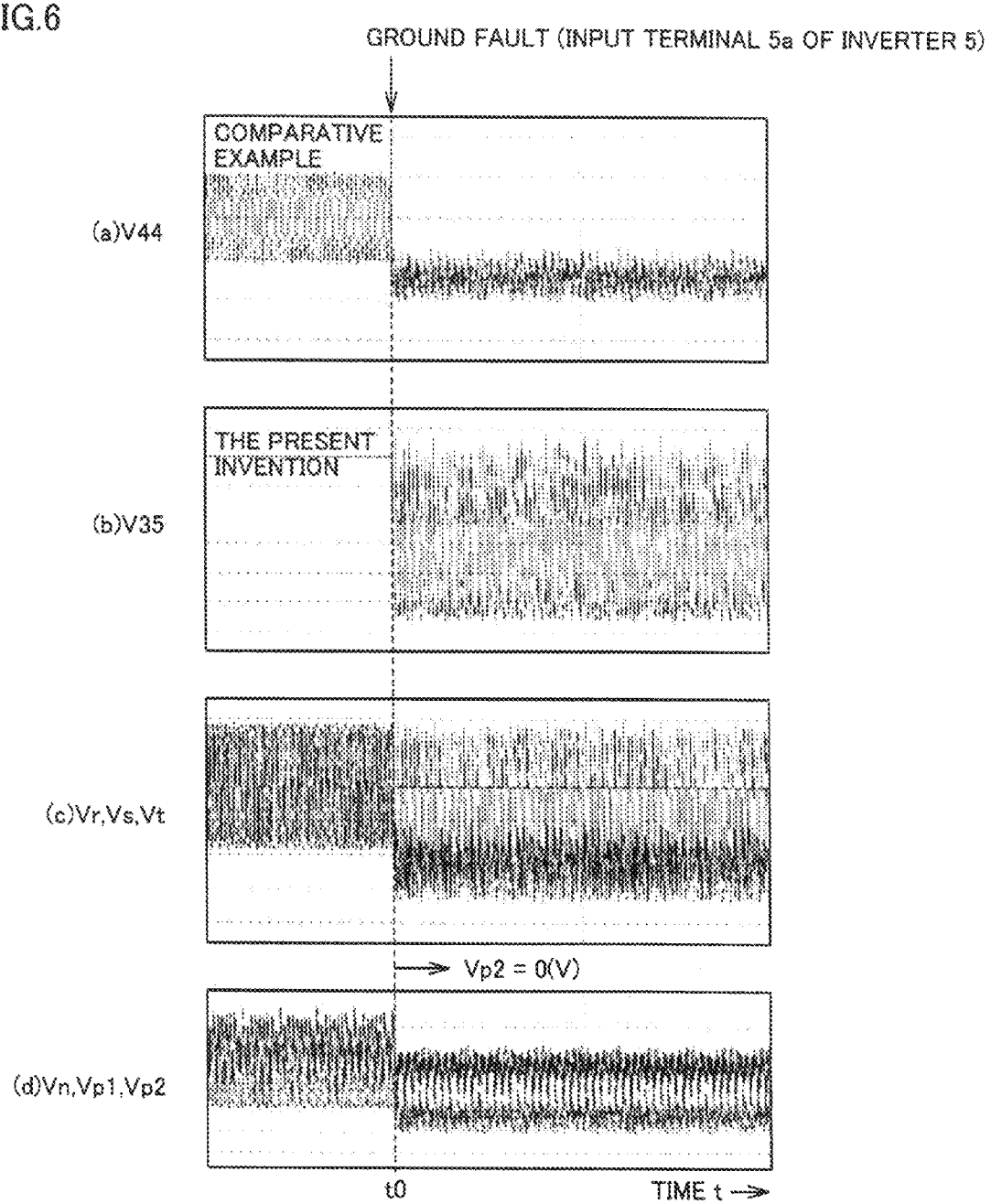
FIG. 6 is a time chart illustrating voltage fluctuations before and after the occurrence of a ground fault in a high-voltage input terminal of the inverter illustrated in FIG. 2.
Figure 7:
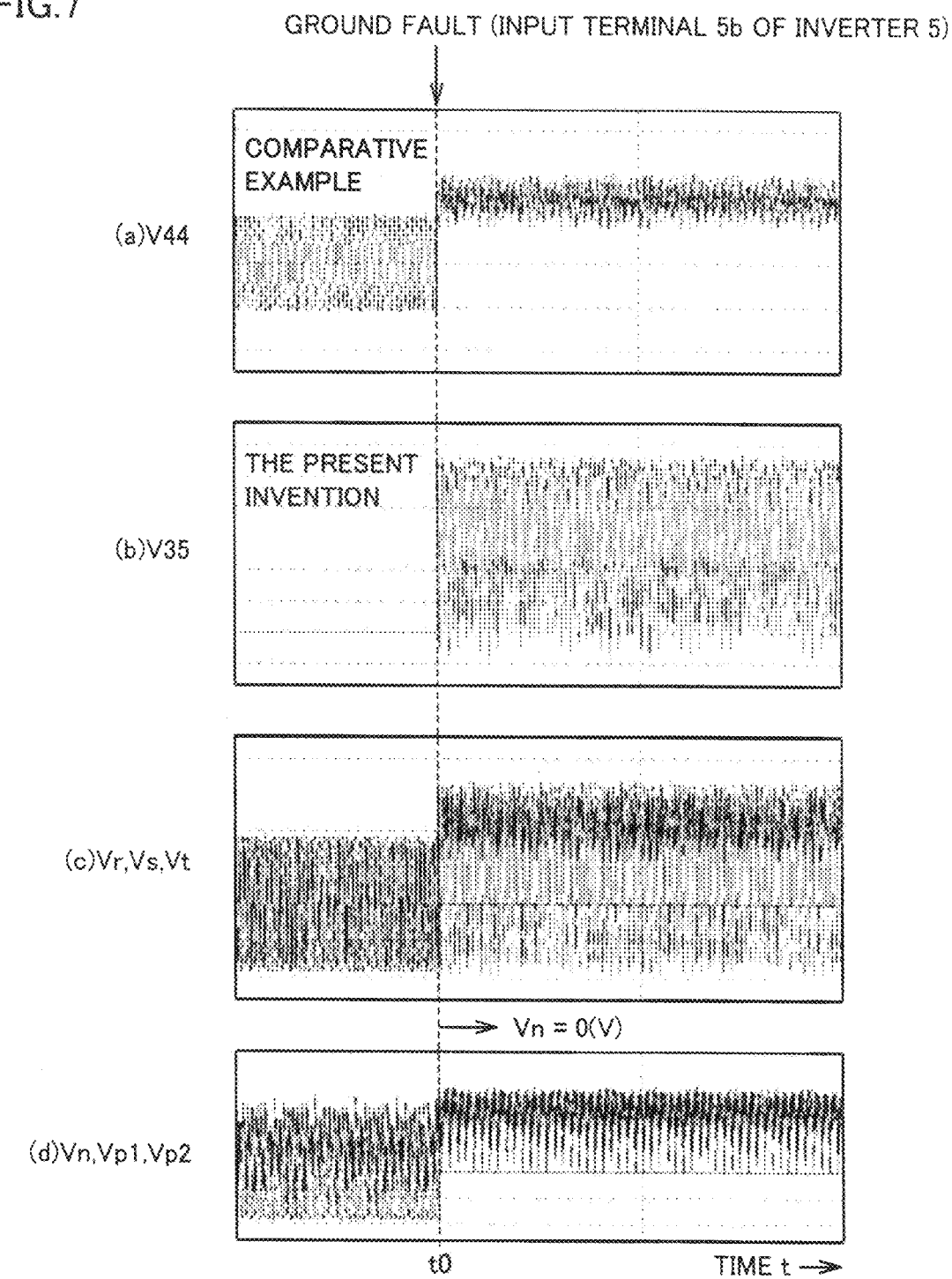
FIG. 7 is a time chart illustrating voltage fluctuations before and after the occurrence of a ground fault in a low-voltage input terminal of the inverter illustrated in FIG. 2.
Figure 8:
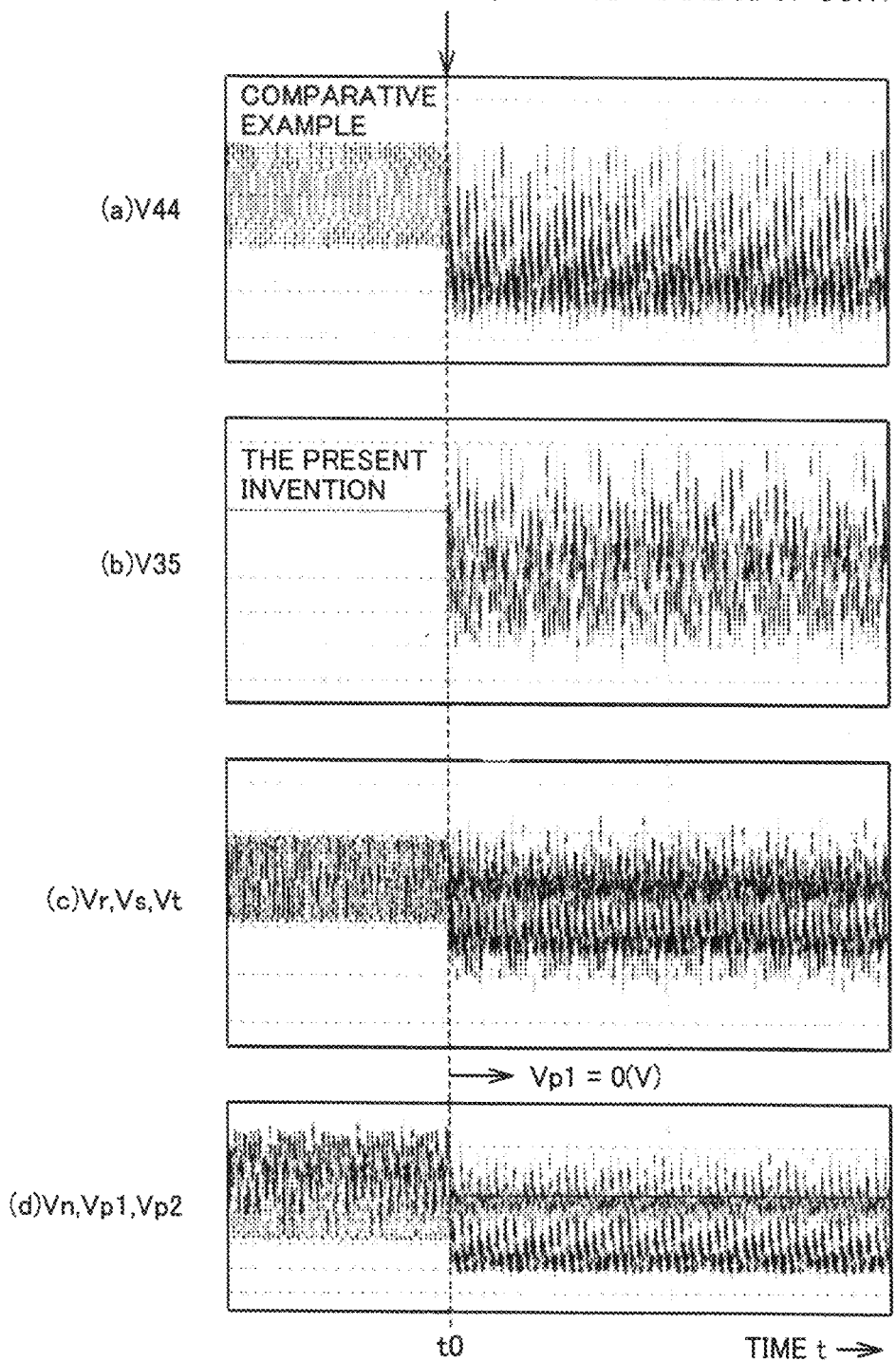
FIG. 8 is a time chart illustrating voltage fluctuations before and after the occurrence of a ground fault in a high-voltage input terminal of the converter illustrated in FIG. 2.
Figure 9:
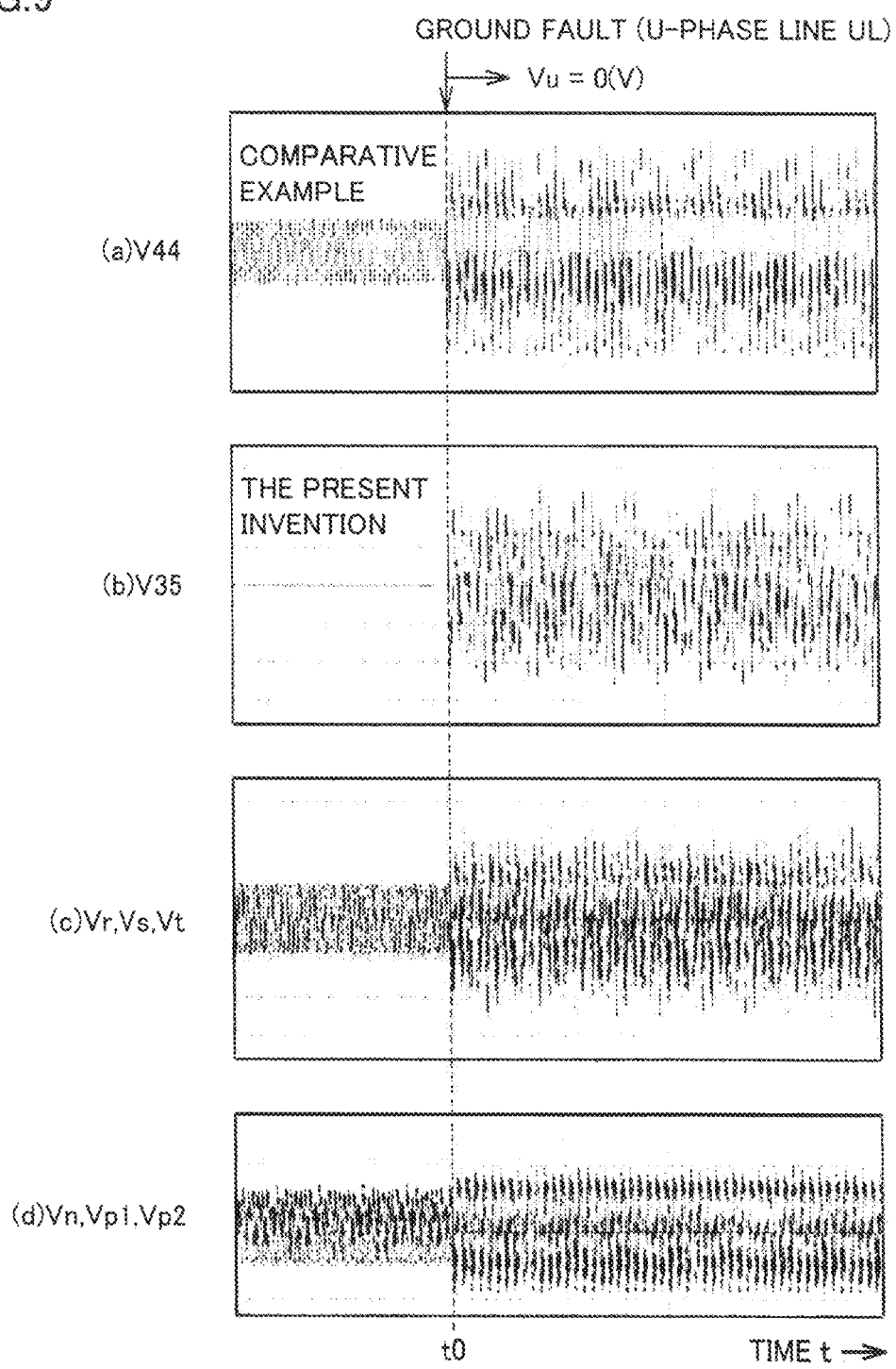
FIG. 9 is a time chart illustrating voltage fluctuations before and after the occurrence of a ground fault in a U-phase line illustrated in FIG. 2.

FIG. 4 is a circuit block diagram illustrating the configuration of a ground fault detecting circuit 40 as a comparative example in comparison with the ground fault detecting circuit illustrated FIG. 3 according to the present embodiment. In FIG. 4, ground fault detecting circuit 40 includes resistance elements 41 to 43, an amplifier 44 and a comparator 45.

One terminals of resistance elements 41 and 42 are connected to input terminals 5a and 5b of inverter 5, respectively, and the other terminals thereof are commonly connected to a node N41. One terminal resistance element 43 is connected to node N41, and the other terminal of resistance element 43 is connected to the line of ground voltage GND.

Amplifier 44 amplifies a voltage V41 across the terminals of resistance element 43. Comparator 45 compares a voltage V44 from amplifier 44 with a predetermined voltage range of VRL to VRH (VRL<VRH), and outputs signal ϕD at a level in accordance with the comparison result. When output voltage V44 from amplifier 44 is within the predetermined voltage range of VRL to VRH (VRL<V44<VRH), signal ϕD is set to the "L" level. When output voltage V44 from amplifier 44 is beyond the predetermined voltage range of VRL to VRH (V44<VRL or VRH<V44), signal ϕD is set to the "H" level.

If no ground fault occurs in the thyristor starter, the voltage obtained by dividing the voltage across input terminals 5a and 5b of inverter 5 with resistance elements 42 and 43 becomes equal to voltage V41 of node N41. Voltage V41 vibrates with a certain amplitude. In this case, VRL<V44<VRH, and thereby, signal ϕD is set to the "L" level which is a non-active level.

If a ground fault has occurred in the thyristor starter, a point that is grounded (for example, R-phase line RL) is connected to the other terminal of resistance element 43 (the line of ground voltage GND) to form a current flowing loop, and thereby, voltage V41 is generated across the terminals of resistance element 43. In this case, V44<VRL or VRH<V44, and thereby, signal ϕD is set to the "H" level which is an active level.

In the following, the ground fault detecting accuracy of ground fault detecting circuit 6 of the present invention and the ground fault detecting accuracy of ground fault detecting circuit 40 of the comparative example will be compared. FIG. 5(a) to FIG. 9(a) each is a time chart illustrating output voltage V44 from amplifier 44 (of the comparative example) illustrated in FIG. 4. FIG. 5(b) to FIG. 9(b) each is a time chart illustrating output voltage V35 from amplifier 35 (of the present embodiment) illustrated in FIG. 3.

FIG. 5(c) to FIG. 9(c) each is a time chart illustrating a voltage Vr of R-phase line RL, a voltage Vs of S-phase line SL and a voltage Vt of T-phase line TL as illustrated in FIG. 2. FIG. 5(d) to FIG. 9(d) each is a time chart illustrating a voltage Vn of low-voltage output terminal 3b of converter 3 (low-voltage output terminal 5b of inverter 5), a voltage Vp1 of high-voltage output terminal 3a of converter 3, and a voltage Vp2 of high-voltage output terminal 5a of inverter 5 as illustrated in FIG. 2. Voltages Vr, Vs, Vt, Vp1 and Vp2 are the same in the comparative example and in the present embodiment.

FIG. 5(a) to FIG. 5(d) each is a time chart illustrating voltage fluctuations before and after the occurrence of a ground fault in R-phase line RL at timing to. As illustrated in FIG. 5(c), three-phase AC voltages Vr, Vs and Vt all fluctuate with a predetermined amplitude in the normal state. After a ground fault has occurred in R-phase line RL at timing t0, R-phase voltage Vr becomes equal to 0 V, and the amplitude of S-phase voltage Vs and T-phase voltage Vt increases.

As illustrated in FIG. 5(d), each DC voltage of Vn, Vp1 and Vp2 does not stay constant but fluctuates with a certain amplitude even in the normal state. After the ground fault has occurred in R-phase line RL at timing t0, the amplitude of DC voltages Vn, Vp1 and Vp2 increases.

Output voltage V44 from amplifier 44 of the comparative example fluctuates in accordance with the voltage obtained by dividing the DC voltage (Vp2−Vn). Thus, as illustrated in FIG. 5(a), voltage V44 fluctuates with a certain amplitude even in the normal state, and the amplitude of voltage V44 increases after a ground fault has occurred in R-phase line RL at timing t0. As described above, since the amplitude of voltage V44 fluctuates before and after timing t0, it is possible to detect the occurrence of a ground fault. However, since the fluctuation before and after timing t0 is small, it is not easy to determine the occurrence of a ground fault.

In this regard, output voltage V35 from amplifier 35 according to the present embodiment is configured to fluctuate in accordance with a voltage obtained by adding up three-phase AC voltages Vr, Vs and Vt. Thus, as illustrated in FIG. 5(b), voltage V35 is about 0 V in the normal state, and the amplitude of voltage V35 increases abruptly after a ground fault has occurred in R-phase line RL at timing t0. As described above, since the amplitude of voltage V35 fluctuates greatly before and after timing t0, it is possible to easily determine the occurrence of a ground fault.

FIG. 6(a) to FIG. 6(d) each illustrates the voltage fluctuations before and after the occurrence of a ground fault in high-voltage input terminal 5a of inverter 5 at timing t0. As illustrated in FIG. 6(d), each DC voltage of Vn, Vp1 and Vp2 does not stay constant but fluctuates with a certain amplitude even in the normal state. After the ground fault has occurred in high-voltage input terminal 5a of inverter 5 at timing t0, DC voltage Vp2 becomes equal to 0 V, and DC voltages Vn and Vp1 both shift to the negative voltage side.

As illustrated in FIG. 6(c), three-phase AC voltages Vr, Vs and Vt all fluctuate at a predetermined amplitude. After the ground fault has occurred in high-voltage input terminal 5a of inverter 5 at timing t0, three-phase AC voltages Vr, Vs and Vt all shift to the negative voltage side.

Output voltage V44 from amplifier 44 of the comparative example fluctuates in accordance with the voltage obtained by dividing the DC voltage (Vp2−Vn). Thus, as illustrated in FIG. 6(a), voltage V44 fluctuates with a certain amplitude even in the normal state, and shifts to the negative voltage side after the ground fault has occurred in high-voltage input terminal 5a of inverter 5 at timing t0. As described above, since voltage V44 shifts before and after timing t0, it is possible to detect the occurrence of a ground fault. However, since the fluctuation before and after timing t0 is small, it is not easy to determine the occurrence of a ground fault. In addition, the amplitude of voltage V44 decreases due to the ground fault, making it impossible to determine the occurrence of a ground fault on the basis of the amplitude of voltage V44.

In this regard, output voltage V35 from amplifier 35 according to the present embodiment is configured to fluctuate in accordance with a voltage obtained by adding up three-phase AC voltages Vr, Vs and Vt. Thus, as illustrated in FIG. 6(b), voltage V35 is about 0 V in the normal state, and the amplitude of voltage V35 increases abruptly after a ground fault has occurred in high-voltage input terminal 5a of inverter 5 at timing t0. As described above, since the amplitude of voltage V35 fluctuates greatly before and after timing t0, it is possible to easily determine the occurrence of a ground fault.

FIG. 7(a) to FIG. 7(d) each illustrates the voltage fluctuations before and after the occurrence of a ground fault in low-voltage input terminal 5b of inverter 5 at timing t0. As illustrated in FIG. 7(d), each DC voltage of Vn, Vp1 and Vp2 does not stay constant but fluctuates with a certain amplitude even in the normal state. After the ground fault has occurred in low-voltage input terminal 5b of inverter 5 at timing t0, DC voltage Vn becomes equal to 0 V, and DC voltages Vp1 and Vp2 both shift to the positive voltage side.

As illustrated in FIG. 7(c), three-phase AC voltages Vr, Vs and Vt all fluctuate at a predetermined amplitude. After the ground fault has occurred in low-voltage input terminal 5b of inverter 5 at timing t0, three-phase AC voltages Vr, Vs and Vt all shift to the positive voltage side.

Output voltage V44 from amplifier 44 of the comparative example fluctuates in accordance with the voltage obtained by dividing the DC voltage (Vp2−Vn). Thus, as illustrated in FIG. 7(a), voltage V44 fluctuates with a certain amplitude even in the normal state, and shifts to the positive voltage side after the ground fault has occurred in low-voltage input terminal 5b of inverter 5 at timing to. As described above, since voltage V44 shifts before and after timing t0, it is possible to detect the occurrence of a ground fault. However, since the fluctuation before and after timing t0 is small, it is not easy to determine the occurrence of a ground fault. In addition, the amplitude of voltage V44 decreases due to the ground fault, making it impossible to determine the occurrence of a ground fault on the basis of the amplitude of voltage V44.

In this regard, output voltage V35 from amplifier 35 according to the present embodiment is configured to fluctuate in accordance with a voltage obtained by adding up three-phase AC voltages Vr, Vs and Vt. Thus, as illustrated in FIG. 7(b), voltage V35 is about 0 V in the normal state, and the amplitude of voltage V35 increases abruptly after a ground fault has occurred in low-voltage input terminal 5b of inverter 5 at timing t0. As described above, since the amplitude of voltage V35 fluctuates greatly before and after timing t0, it is possible to easily determine the occurrence of a ground fault.

FIG. 8(a) to FIG. 8(d) each illustrates the voltage fluctuations before and after the occurrence of a ground fault in high-voltage input terminal 3a of converter 3 at timing t0. As illustrated in FIG. 8(d), each DC voltage of Vn, Vp1 and Vp2 does not stay constant but fluctuates with a certain amplitude even in the normal state. After the ground fault has occurred in high-voltage input terminal 3a of converter 3 at timing t0, DC voltage Vp1 becomes equal to 0 V, and DC voltages Vn and Vp2 both shift to the negative voltage side.

As illustrated in FIG. 8(c), three-phase AC voltages Vr, Vs and Vt all fluctuate at a predetermined amplitude. After the ground fault has occurred in high-voltage input terminal 3a of converter 3 at timing t0, three-phase AC voltages Vr, Vs and Vt all shift to the negative voltage side.

Output voltage V44 from amplifier 44 of the comparative example fluctuates in accordance with the voltage obtained by dividing the DC voltage (Vp2−Vn). Thus, as illustrated in FIG. 8(a), voltage V44 fluctuates with a certain amplitude even in the normal state, and shifts to the negative voltage side after the ground fault has occurred in high-voltage input terminal 3a of converter 3 at timing t0. As described above, since voltage V44 shifts before and after timing t0, it is possible to detect the occurrence of a ground fault. However, since the fluctuation before and after timing t0 is small, it is not easy to determine the occurrence of a ground fault.

In this regard, output voltage V35 from amplifier 35 according to the present embodiment is configured to fluctuate in accordance with a voltage obtained by adding up three-phase AC voltages Vr, Vs and Vt. Thus, as illustrated in FIG. 8(b), voltage V35 is about 0 V in the normal state, and the amplitude of voltage V35 increases abruptly after a ground fault has occurred in high-voltage input terminal 3a of converter 3 at timing t0. As described above, since the amplitude of voltage V35 fluctuates greatly before and after timing t0, it is possible to easily determine the occurrence of a ground fault.

FIG. 9(a) to FIG. 9(d) each is a time chart illustrating voltage fluctuations before and after the occurrence of a ground fault in U-phase line UL at timing t0. As illustrated in FIG. 9(c), three-phase AC voltages Vr, Vs and Vt all fluctuate with a predetermined amplitude in the normal state. After a ground fault has occurred in U-phase line UL at timing t0, the amplitude of three-phase voltages Vr, Vs and Vt increases.

As illustrated in FIG. 9(d), each DC voltage of Vn, Vp1 and Vp2 does not stay constant but fluctuates with a certain amplitude even in the normal state. After the ground fault has occurred in U-phase line UL at timing t0, the amplitude of DC voltages Vr, Vs and Vt increases.

Output voltage V44 from amplifier 44 of the comparative example fluctuates in accordance with the voltage obtained by dividing the DC voltage (Vp2−Vn). Thus, as illustrated in FIG. 9(a), voltage V44 fluctuates with a certain amplitude even in the normal state, and the amplitude of voltage V44 increases after a ground fault has occurred in U-phase line UL at timing to. As described above, since the amplitude of voltage V44 fluctuates before and after timing t0, it is possible to detect the occurrence of a ground fault. However, since the fluctuation before and after timing t0 is small, it is not easy to determine the occurrence of a ground fault.

In this regard, output voltage V35 from amplifier 35 according to the present embodiment is configured to fluctuate in accordance with a voltage obtained by adding up three-phase AC voltages Vr, Vs and Vt. Thus, as illustrated in FIG. 9(b), voltage V35 is about 0 V in the normal state, and the amplitude of voltage V35 increases abruptly after a ground fault has occurred in U-phase line UL at timing t0. As described above, since the amplitude of voltage V35 fluctuates greatly before and after timing t0, it is possible to easily determine the occurrence of a ground fault.

Figure 10:
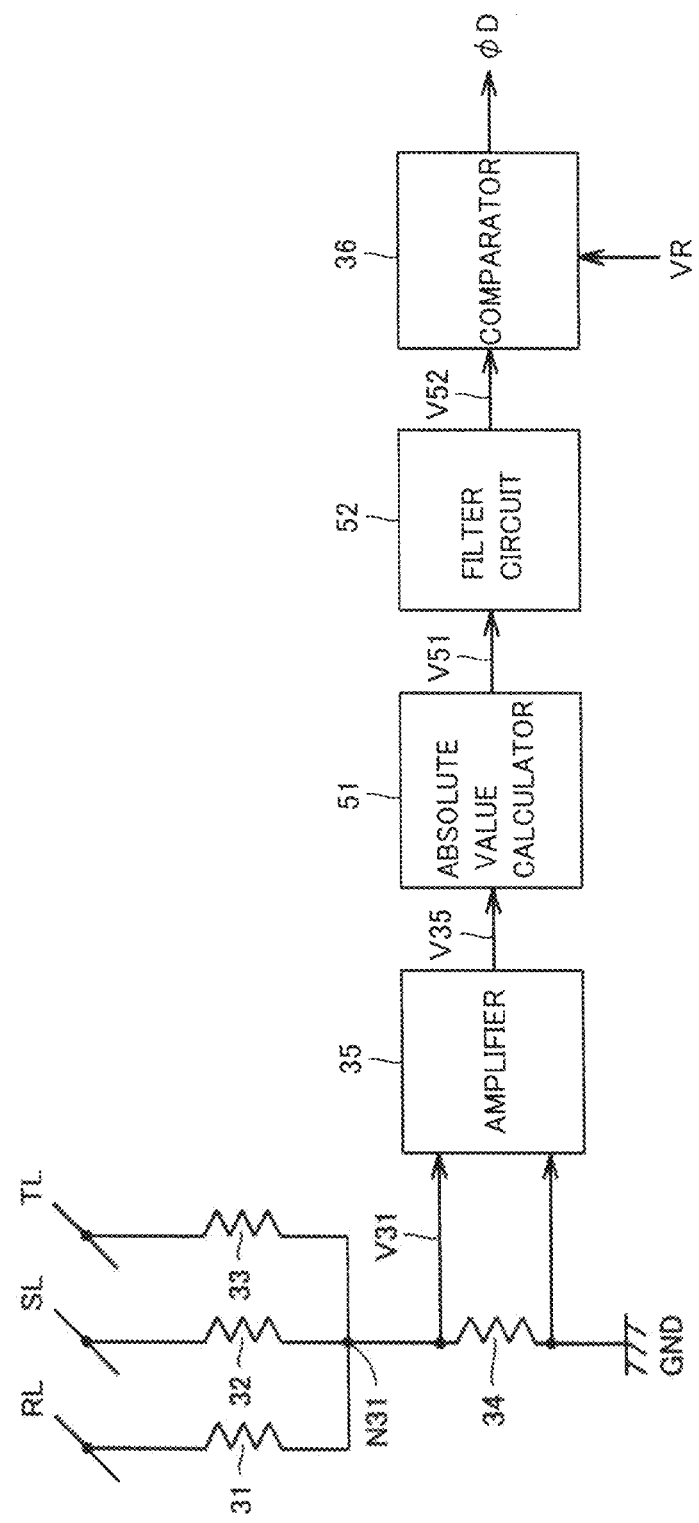
FIG. 10 is a circuit block diagram illustrating a modification of an embodiment of the present invention.

FIG. 10 is a circuit block diagram illustrating the configuration of a ground fault detecting circuit 50 according to a modification of the present embodiment in comparison with the ground fault detecting circuit illustrated in FIG. 3. With reference to FIG. 10, ground fault detecting circuit 50 according to the modification is achieved by adding an absolute value calculator 51 and a filter circuit 52 between amplifier 35 and comparator 36 in ground fault detecting circuit 6 as illustrated in FIG. 3. Absolute value calculator 51 calculates an absolute value |V35| of output voltage V35 from amplifier 35 and outputs a voltage V51 at a level in accordance with absolute value |V35|. Filter circuit 52 is a low pass filter for removing high frequency components from voltage V51 output from absolute value calculator 51. Comparator 36 compares a voltage V52 output from filter circuit 52 with a predetermined reference voltage VR, and outputs signal φD at a level in accordance with the comparison result.

When voltage V52 output from filter circuit 52 is smaller than reference voltage VR (V52<VR), signal φD is set to the "L" level. When output voltage V52 from filter circuit 52 is greater than reference voltage VR (VR<V52), signal φD is set to the "H" level. In the present modification, despite that output voltage V35 from amplifier 35 shifts to the positive or negative voltage side due to a ground fault, it is possible to determine the occurrence of the ground fault easily and accurately.

It should be understood that the embodiments disclosed herein have been presented for the purpose of illustration and description but not limited in all aspects. It is intended that the scope of the present invention is not limited to the description above but defined by the scope of the claims and encompasses all modifications equivalent in meaning and scope to the claims.

REFERENCE SIGNS LIST

1: AC power supply; 2: three-phase transformer; 3: converter; 3a: high-voltage output terminal; 3b: low voltage output terminal; 4: DC reactor; 5: inverter; 5a: high-voltage input terminal; 5b: low voltage input terminal; 6, 40, 50: ground fault detecting circuit; 7: control circuit; 8: synchronous motor; 11-16, 21-26: thyristor; 31-34, 41-43: resistance element; 35, 44: amplifier; 36, 45: comparator; 51: absolute value calculator; 52: filter circuit; RL: R-phase line; SL: S-phase line; TL: T-phase line; UL: U-phase line; VL: V-phase line; WL: W-phase line

The invention claimed is:

1. A thyristor starter for starting a synchronous motor comprising:
   a converter configured to convert a first three-phase AC power to DC power;
   a DC reactor configured to smooth said DC power;
   an inverter configured to convert said DC power supplied from said converter through the intermediary of said DC reactor to a second three-phase AC power, and supply said second three-phase AC power to said synchronous motor through first to third AC lines;
   a ground fault detecting circuit configured to detect a ground fault in said thyristor starter; and
   a control circuit configured to control said converter and said inverter to start said synchronous motor, and to stop the operation of said converter and said inverter when said ground fault has been detected by said ground fault detecting circuit,
   said ground fault detecting circuit including
      first to fourth resistance elements, one terminals of said first to third resistance elements being connected to said first to third AC lines, respectively, the other terminals of three of said resistance elements being commonly connected to one terminal of said fourth resistance elements, and the other terminal of said fourth resistance element being configured to receive a ground voltage,
   said converter including first and second terminals configured to output DC voltage,
   said inverter including third and fourth terminals configured to receive the DC voltage,
   said DC reactor being connected between said first and third terminals,
   said second and fourth terminals being connected to each other,
   a voltage across the terminals of said fourth resistance element being about 0 V when no ground fault occurs, and the voltage across the terminals of the fourth resistance element increasing in amplitude when the ground fault occurs in at least one of said first to third terminals and said first to third AC lines, and said ground fault detecting circuit further including
- a determination circuit configured to determine that said ground fault has occurred in at least one of said first to third terminals and said first to third AC lines when a voltage across the terminals of said fourth resistance element is greater than a predetermined voltage.

2. The thyristor starter according to claim 1, wherein said determination circuit includes
- an absolute value calculator configured to calculate an absolute value of said voltage across the terminals of said fourth resistance element, and
- a comparator configured to output a signal representing that said ground fault has occurred in said thyristor starter when the absolute value calculated by said absolute value calculator on said voltage across the terminals of said fourth resistance element is greater than a predetermined value.

3. The thyristor starter according to claim 2, wherein said thyristor starter starts a synchronous generator in a power plant as said synchronous motor.

4. The thyristor starter according to claim 1, wherein said thyristor starter starts a synchronous generator in a power plant as said synchronous motor.

* * * * *